United States Patent
Pranatharthiharan et al.

(10) Patent No.: US 9,812,368 B2
(45) Date of Patent: Nov. 7, 2017

(54) METHOD TO PREVENT LATERAL EPITAXIAL GROWTH IN SEMICONDUCTOR DEVICES

(71) Applicants: International Business Machines Corporation, Armonk, NY (US); GlobalFoundries, Inc., Georgetown, Grand Cayman (KY)

(72) Inventors: Balasubramanian Pranatharthiharan, Watervliet, NY (US); Hui Zang, Guilderland, NY (US)

(73) Assignees: International Business Machines Corporation, Armonk, NY (US); Global Foundries, Grand Cayman (KY)

( * ) Notice: Subject to any disclaimer, the term of this patent is extended or adjusted under 35 U.S.C. 154(b) by 0 days.

(21) Appl. No.: 15/289,158

(22) Filed: Oct. 8, 2016

(65) Prior Publication Data

US 2017/0162451 A1    Jun. 8, 2017

Related U.S. Application Data

(63) Continuation of application No. 14/960,380, filed on Dec. 5, 2015, now Pat. No. 9,590,074.

(51) Int. Cl.
*H01L 21/8236* (2006.01)
*H01L 21/8238* (2006.01)
(Continued)

(52) U.S. Cl.
CPC ............. *H01L 21/823878* (2013.01); *H01L 21/823814* (2013.01); *H01L 21/823821* (2013.01);
(Continued)

(58) Field of Classification Search
CPC ......... H01L 21/823878; H01L 27/1104; H01L 27/1116; H01L 21/823821;
(Continued)

(56) References Cited

U.S. PATENT DOCUMENTS 7,381,649 B2    6/2008    Chen
7,888,201 B2    2/2011    Yeo
(Continued)

FOREIGN PATENT DOCUMENTS

JP          2010093012 A         4/2010

OTHER PUBLICATIONS

List of IBM Patents or Patent Applications Treated as Related.

*Primary Examiner* — Thinh T Nguyen
(74) *Attorney, Agent, or Firm* — Jeffrey S LaBaw; Steven J Meyers

(57) ABSTRACT

The method for preventing epitaxial growth in a semiconductor device begins with cutting a set of long fins into a set of fins of a FinFET structure. Each of the set of fins has respective cut faces located at the fin ends of a set of fin ends. A photoresist layer is patterned over the set of fin ends on the set of fins of the FinFET structure. The set of fins are isolated from one another by a first dielectric material. The photoresist is patterned over the set of fin ends so that it differs from the photoresist pattern over other areas of the FinFET structure. A set of dielectric blocks is formed on the set of fin ends using the photoresist pattern. The set of dielectric blocks prevents epitaxial growth at the set of fin ends in a subsequent epitaxial growth step.

9 Claims, 15 Drawing Sheets

(51) Int. Cl.
*H01L 27/11* (2006.01)
*H01L 29/78* (2006.01)
*H01L 21/304* (2006.01)
*H01L 29/66* (2006.01)

(52) U.S. Cl.
CPC ...... *H01L 27/1104* (2013.01); *H01L 27/1116* (2013.01); *H01L 21/3043* (2013.01); *H01L 29/6656* (2013.01); *H01L 29/785* (2013.01)

(58) Field of Classification Search
CPC ......... H01L 21/823814; H01L 29/6656; H01L 29/785; H01L 21/30604; H01L 21/31051
USPC ............... 438/222, 151, 152, 218, 290, 279; 257/368, 390, 397, 347, E21.661
See application file for complete search history.

(56) References Cited

U.S. PATENT DOCUMENTS

| | | |
|---|---|---|
| 8,367,498 B2 | 2/2013 | Chang |
| 8,519,476 B2 | 8/2013 | Chen |
| 8,637,931 B2 | 1/2014 | Basker |
| 8,878,300 B1 | 11/2014 | Liu |
| 8,981,493 B2 | 3/2015 | Cheng |
| 9,070,742 B2 | 6/2015 | Xie |
| 9,287,401 B2 | 3/2016 | Lee |
| 2005/0029603 A1 | 2/2005 | Yu |
| 2007/0026629 A1 | 2/2007 | Chen |
| 2008/0308848 A1 | 12/2008 | Inaba |
| 2012/0091528 A1 | 4/2012 | Chang |
| 2014/0264604 A1* | 9/2014 | Tsai ..................... H01L 29/785 257/347 |
| 2015/0056792 A1 | 2/2015 | Adam |
| 2015/0137263 A1 | 5/2015 | Lee |

* cited by examiner

SECTION YY1-YY1

SECTION YY2-YY2

SECTION XX-XX

SECTION YY1-YY1

SECTION XX-XX

SECTION YY2-YY2

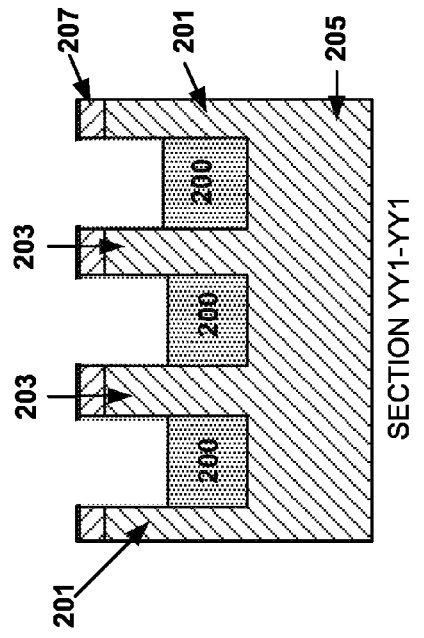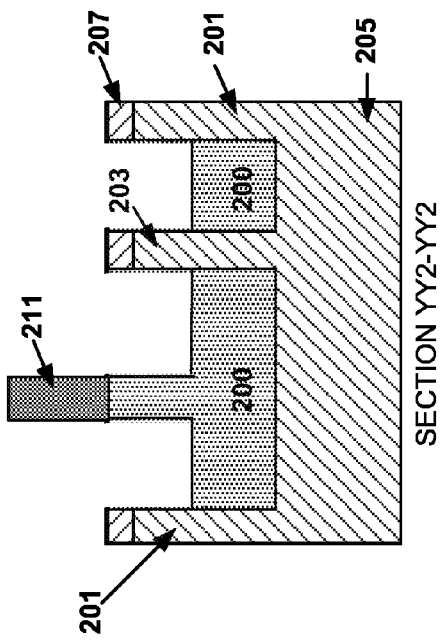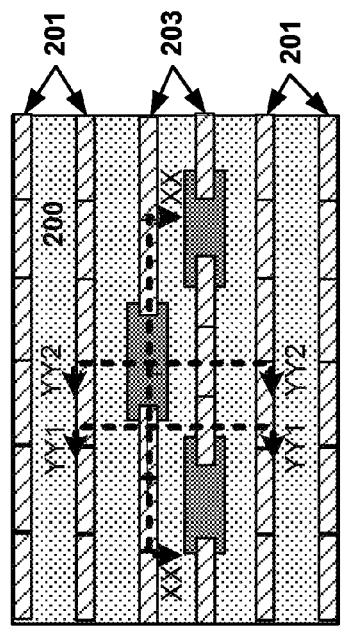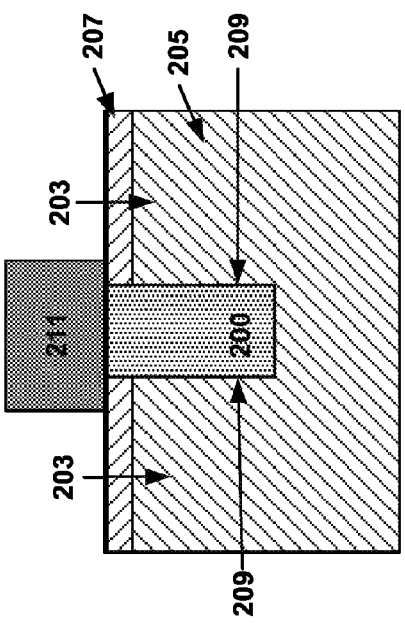

SECTION YY1-YY1

SECTION YY2-YY2

SECTION XX-XX

SECTION YY1-YY1

SECTION YY2-YY2

SECTION XX-XX

SECTION YY1-YY1

SECTION YY2-YY2

SECTION XX-XX

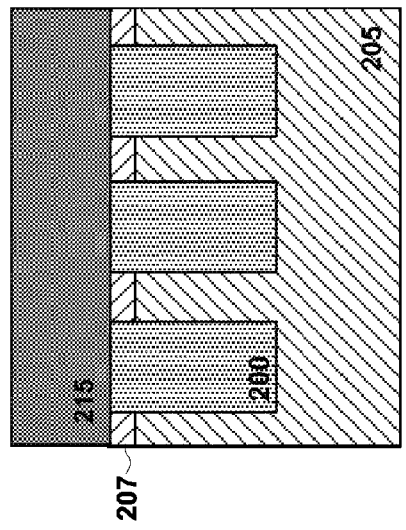
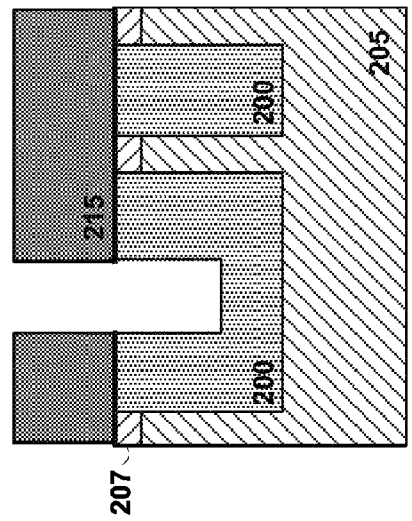
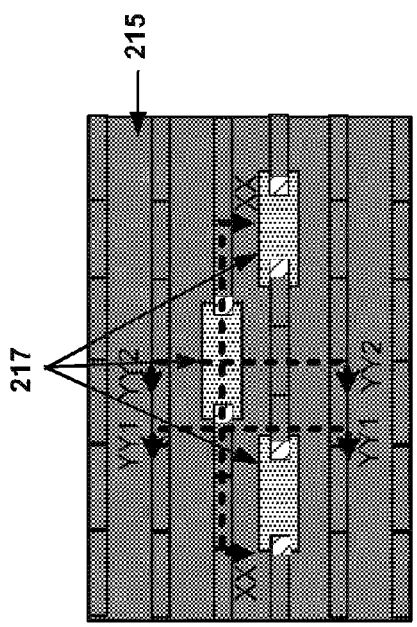
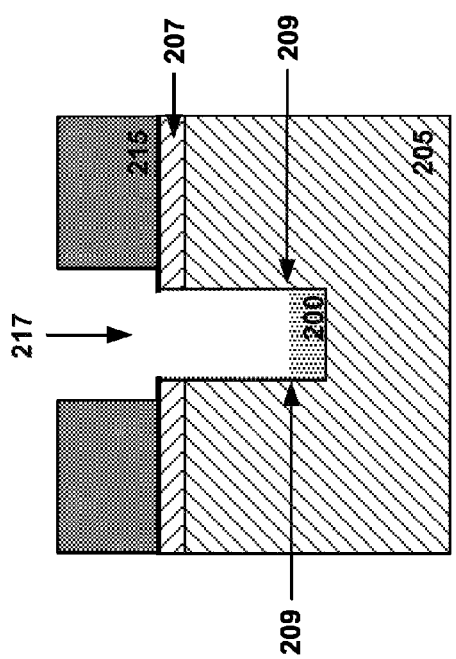

SECTION YY1-YY1

SECTION YY2-YY2

SECTION XX-XX

SECTION YY1-YY1

SECTION YY3-YY3

SECTION YY2-YY2

SECTION XX-XX

SECTION YY1-YY1

SECTION YY2-YY2

SECTION XX-XX

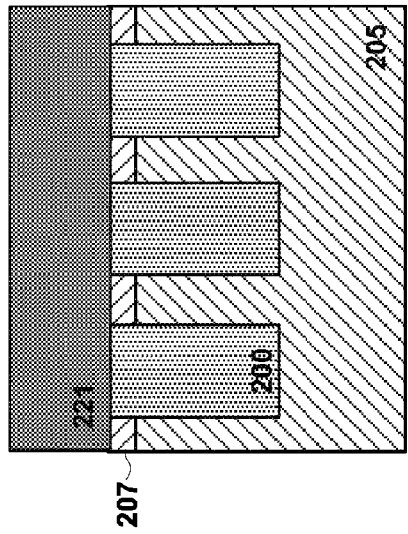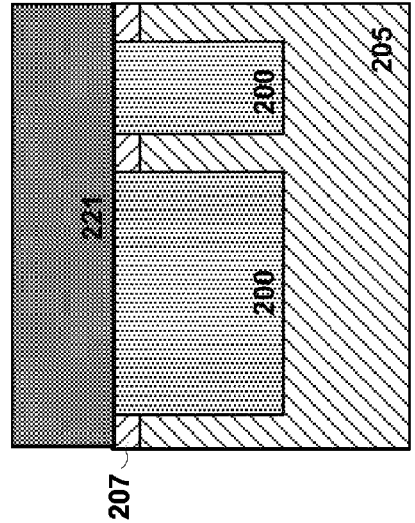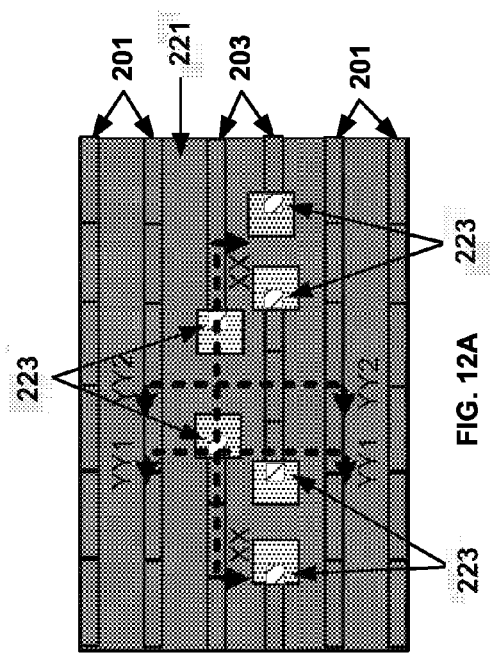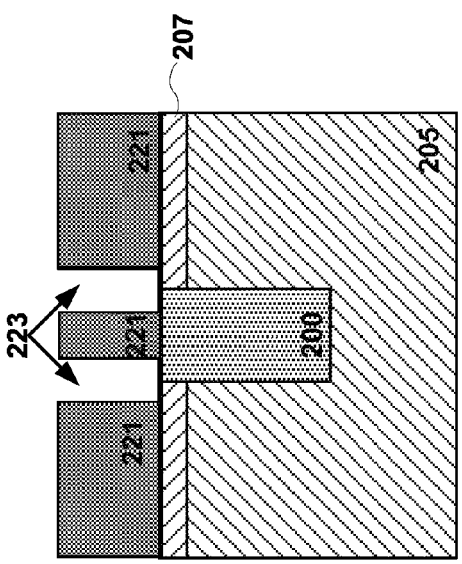

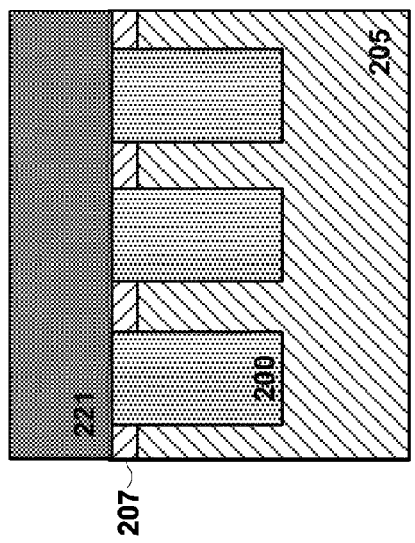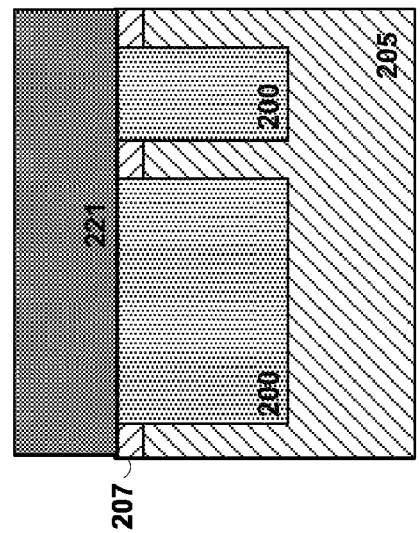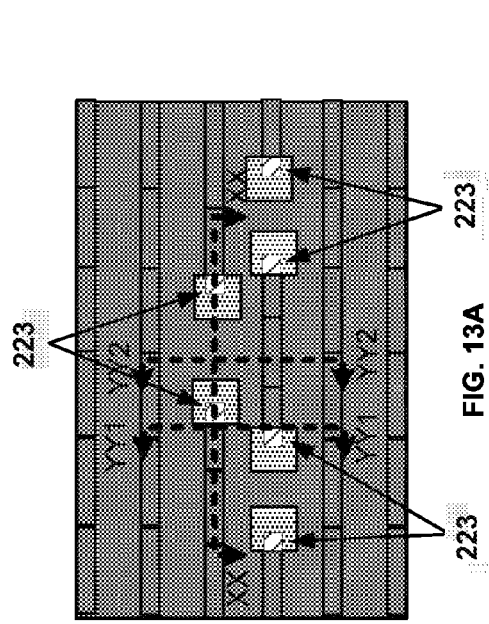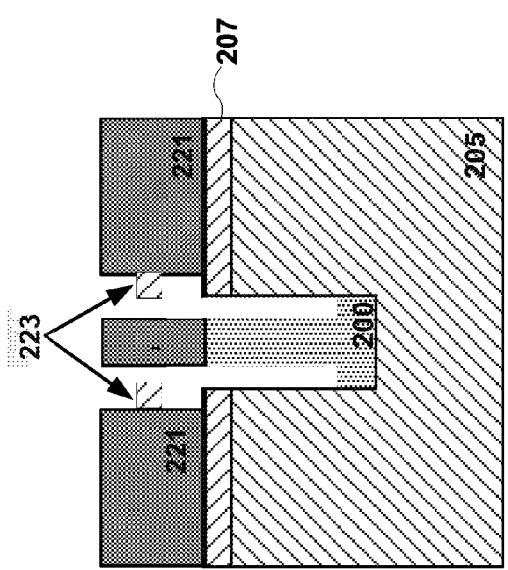

SECTION YY1-YY1

SECTION YY2-YY2

SECTION XX-XX

SECTION YY1-YY1

SECTION YY3-YY3

SECTION YY2-YY2

SECTION XX-XX

METHOD TO PREVENT LATERAL EPITAXIAL GROWTH IN SEMICONDUCTOR DEVICES

BACKGROUND OF THE INVENTION

This disclosure relates to integrated circuit devices, and more specifically, to a method and structure to prevent epitaxial growth in semiconductor devices.

As the dimensions of modern integrated circuitry in semiconductor chips continue to shrink, conventional semiconductor processing is increasingly challenged to make structures at finer dimensions. Planar field effect transistor (FET) technology has become constrained at smaller geometries due to leakage effects. The semiconductor industry has found an alternative approach to planar FETs with fin field effect transistors (FinFETs) to reduce leakage current in semiconductor devices. In a FinFET, an active region including the drain, the channel region and the source protrudes up from the surface of the semiconductor substrate upon which the FinFET is located. Due to the many superior attributes, especially in the areas of device performance, off-state leakage and foot print, FinFETs are replacing planar FETs, to enable the scaling of gate lengths to 14 nm and below. A type of FinFET called a multiple gate field-effect transistor, or MuGFET, is often used in logic devices.

A typical static random-access memory (static RAM or SRAM), when implemented in FinFETs, is comprised of three different types of FinFETs: pull-up (PU) FinFETs, pass-gate (PG) FinFETs, and pull-down (PD) FinFETs. In dimensions of 14 nm and below, the pull up FinFET active distance is one of factors which limit the density of the integrated circuit. The PU FinFET to PU FinFET epitaxy short is an SRAM and logic device yield issue.

BRIEF SUMMARY

According to this disclosure, a method for constructing the structure are described. The method for preventing epitaxial growth in a semiconductor device begins with cutting a set of long fins into a set of fins of a FinFET structure. Each of the set of fins has respective cut faces located at the fin ends of a set of fin ends. A photoresist layer is patterned over the set of fin ends on the set of fins of the FinFET structure. The set of fins are isolated from one another by a first dielectric material. The photoresist is patterned over the set of fin ends so that it differs from the photoresist pattern over other areas of the FinFET structure. A set of dielectric blocks is formed on the set of fin ends using the photoresist pattern. The set of dielectric blocks prevents epitaxial growth at the set of fin ends in a subsequent epitaxial growth step.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which:

FIGS. 4A-4D are respectively a top and cross-sectional diagrams depicting fin formation in the process of fabricating a FinFET according to a first embodiment of the invention;

FIGS. 8A-8D are respectively a top and cross-sectional diagrams depicting fin formation in the process of fabricating a FinFET according to a second embodiment of the invention;

FIGS. 12A-12D are respectively a top and cross-sectional diagrams depicting fin formation in the process of fabricating a FinFET according to a third embodiment of the invention;

FIGS. 13A-13D are respectively a top and cross-sectional diagrams depicting fin formation in the process of fabricating a FinFET according to a third embodiment of the invention;

DETAILED DESCRIPTION OF THE DRAWINGS

Figure 1:
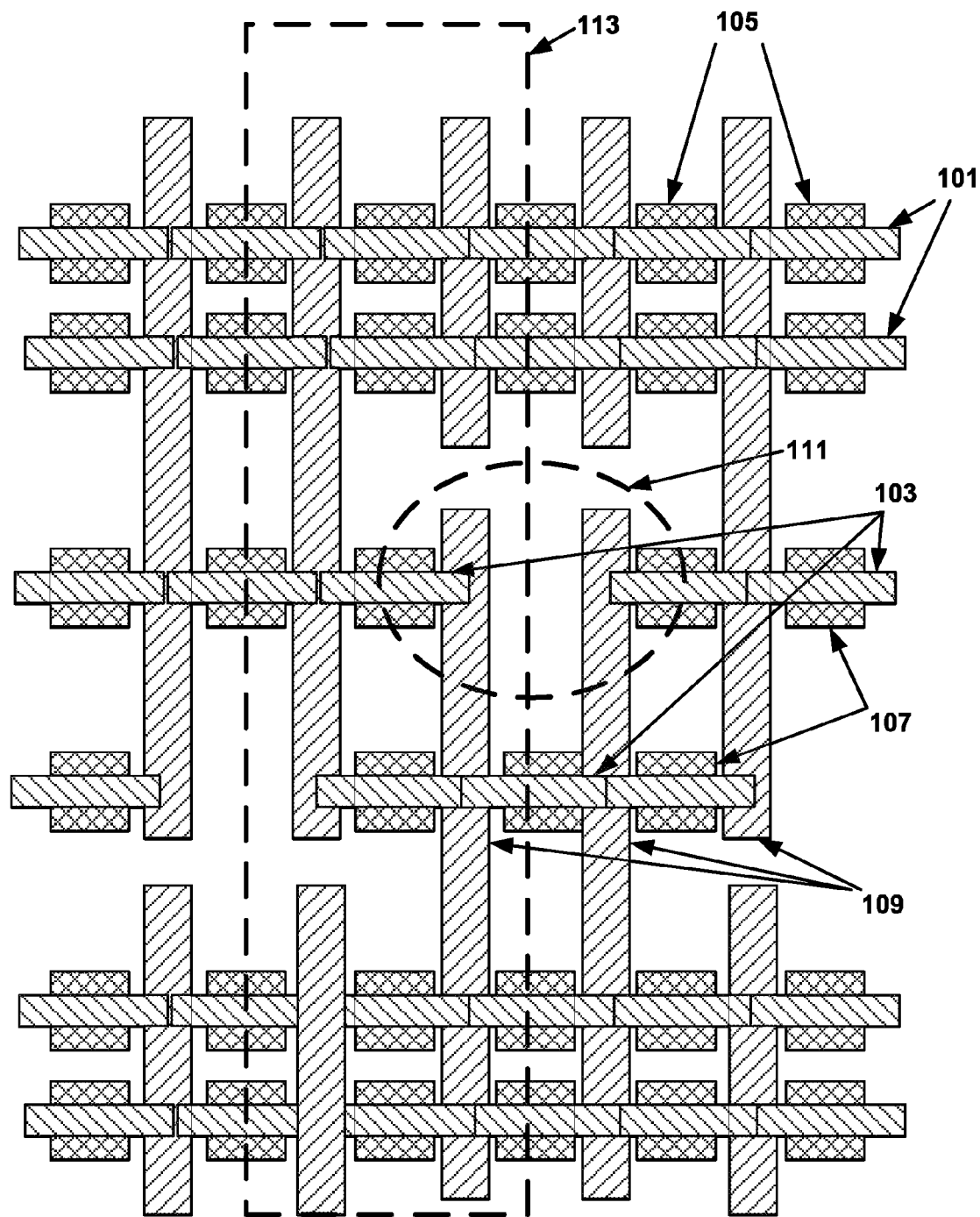
FIG. 1 is a top view of an SRAM device comprised of a plurality of FinFETs.

At a high level, the invention includes a structure and method for fabricating the structure for preventing excessive epitaxial growth on the fin end of a FinFET device, e.g., both for logic FinFETs or for a pull-up FinFET or pFinFET in SRAM. A dielectric block is fabricated at the fin end to prevent the silicon of the fin end from providing a "seed" for epitaxial growth at the fin end where it is not needed, while allowing epitaxial silicon to grow on the fin sides for the source and drain of the FinFET.

A "substrate" as used herein can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures, etc.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes insulating material from vertical surfaces, thereby leaving insulating material along the vertical sidewalls of structures. This material left on the vertical sidewalls is referred to as sidewall structures. The sidewall structures can be used as masking structures for further semiconducting processing steps.

While the invention applies to a static random-access memory (SRAM) formed of fin field effect transistors (FinFETs), embodiments of the invention may also be applied to a variety of semiconductor devices which utilize FinFETs. Static random-access memory (SRAM) is a type of volatile semiconductor memory that uses bistable latching circuitry to store each bit. Typically, each bit in an SRAM is stored on four transistors, two pull-up (PU) transistors and two pull-down (PD) transistors that form two cross-coupled inverters. This memory cell has two stable states which are used to denote 0and 1. Two additional access transistors or pass-gate transistors control the access to a storage cell during read and write operations. Typically, the pulldown and pass-gate transistors are n-channel FETs or nFETs and the pull-down transistors are p-Channel FETs or pFETs. When the SRAMs are built with FinFET structures, the PD and PG transistors are nFinFETs and the PU transistors are pFinFETs. The invention can be used in FinFETs which are included in logic devices in addition to FinFETs in SRAMs.

Embodiments will be explained below with reference to the accompanying drawings.

FIG. 1 is a top view of an SRAM device comprised of a plurality of FinFETs. The rows of the fins of PD and PG devices 101 and rows of the fins of the PU devices 103 are shown. The source and drain of the nFinFETs 105 and the source and drain of the pFinFETs 107 are created in part by an epitaxial step. The regions 109 indicate the positions of the gates which can be fabricated of polysilicon or metal. The epitaxial growth step is used to create an increased volume of silicon for the source and drain for device improvement which grow on the fins 101, 103 to create the nFinFETs epitaxial regions 105 and the pFinFETs epitaxial regions 107. Epitaxy is a deposition of a crystalline overlayer on a crystalline substrate. The fins, being composed of silicon, act as a "seed" for the epitaxial regions. The problem which the invention improves is that at the ends of the pFinFETs, see for example region 111, during the epitaxial growth step, excess epitaxial silicon is grown where it is not desired. The excess growth causes shorts, reducing yield and presents a limiting factor in reducing the geometry of the SRAM circuit. This problem occurs where the fin is "cut" to create a pair of FinFETs or individual FinFETs from a long fin. The dashed box 113 indicates the FinFETs which comprise a single SRAM circuit. The invention can be used in FinFETs for both SRAMs and logic devices.

Figure 2B:
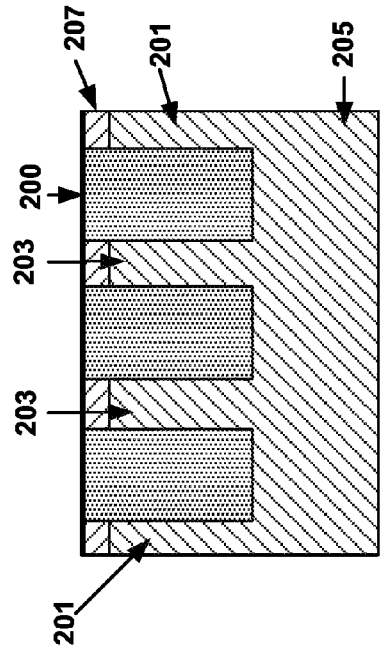
FIGS. 2A-2D are respectively a top and cross-sectional diagrams depicting fin formation in the process of fabricating a FinFET according to a first embodiment of the invention.
Figure 2D:
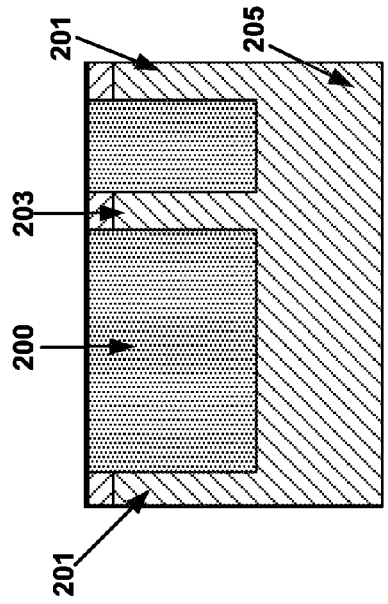
Figure 2A:
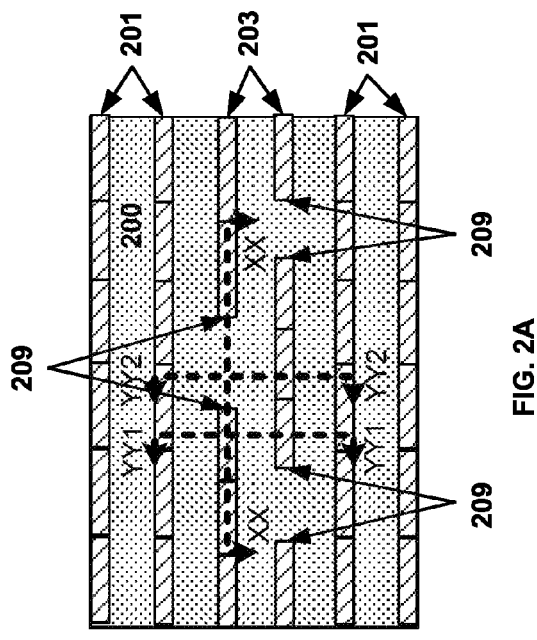
Figure 2C:
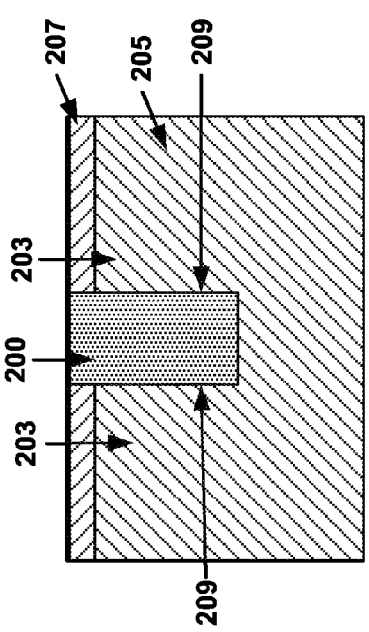
Figure 3A:
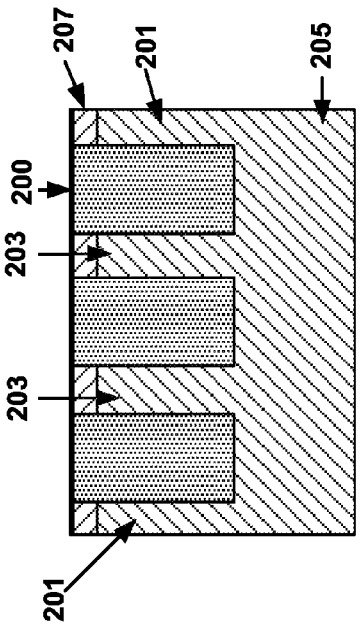
FIGS. 3A-3D are respectively a top and cross-sectional diagrams depicting fin formation in the process of fabricating a FinFET according to a first embodiment of the invention.
Figure 3B:
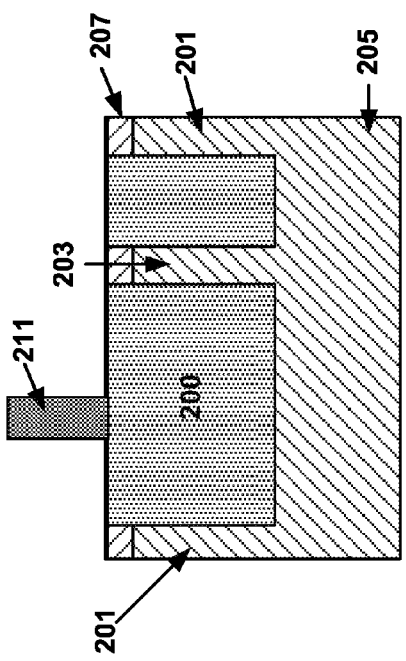
Figure 3C:
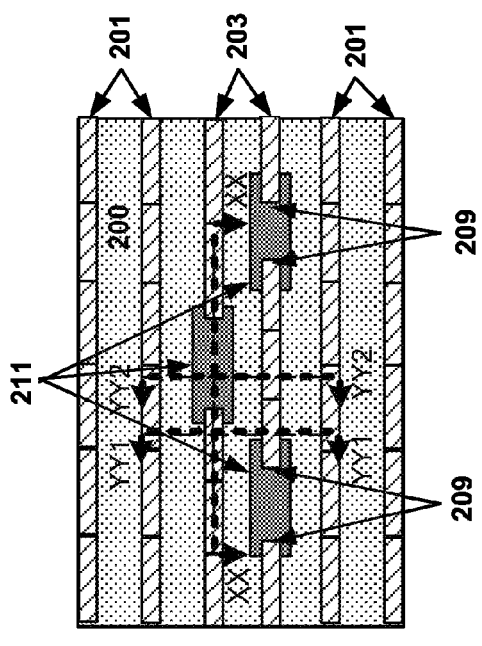
Figure 3D:
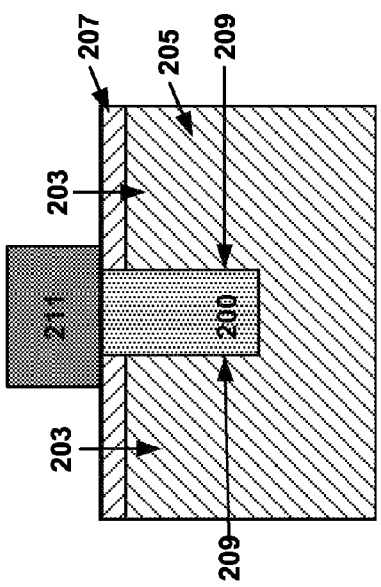
Figure 5B:
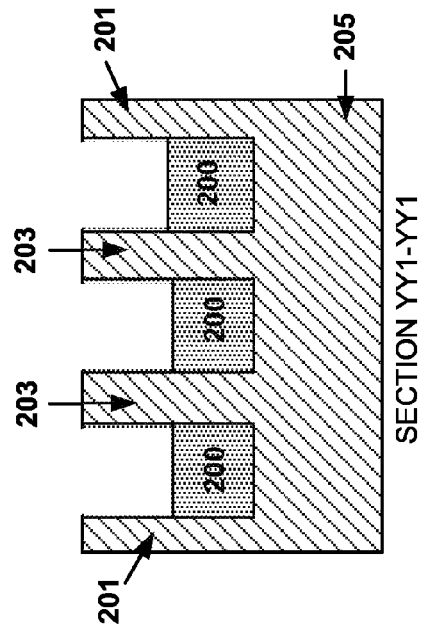
FIGS. 5A-5D are respectively a top and cross-sectional diagrams depicting fin formation in the process of fabricating a FinFET according to a first embodiment of the invention.
Figure 5D:
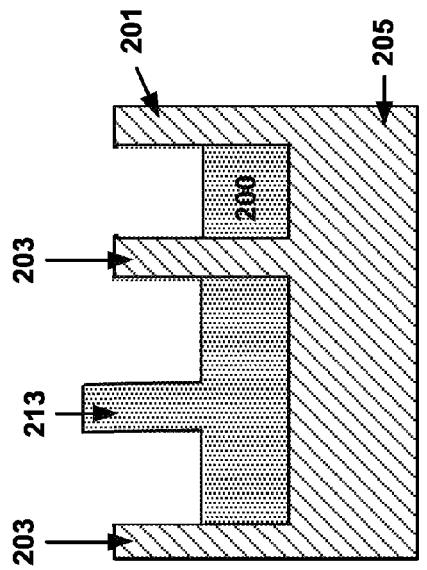
Figure 5A:
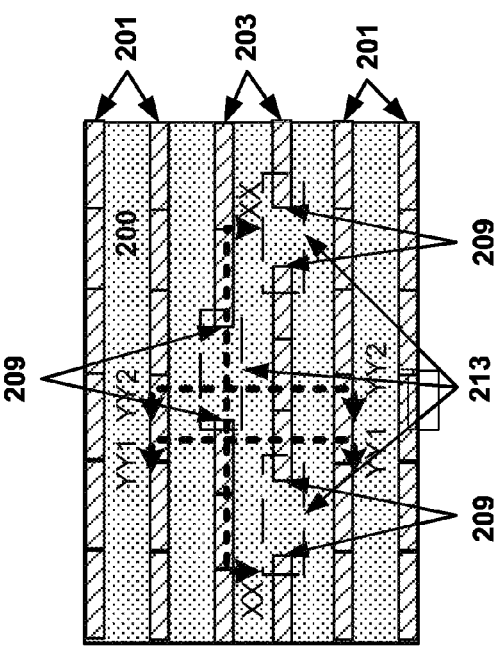
Figure 5C:
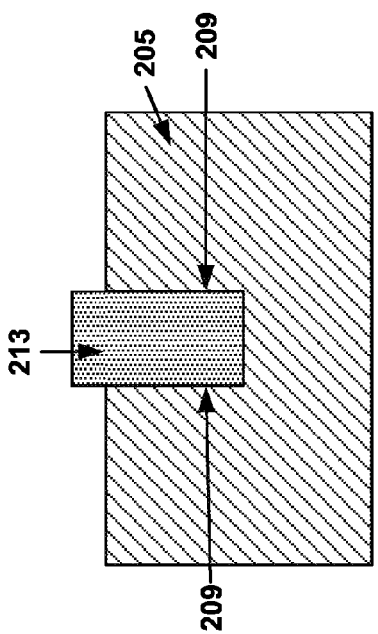
Figure 6B:
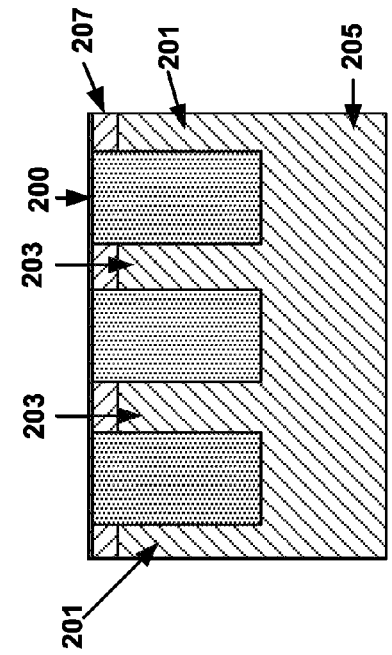
FIGS. 6A-6D are respectively a top and cross-sectional diagrams depicting fin formation in the process of fabricating a FinFET according to a second embodiment of the invention.
Figure 6D:
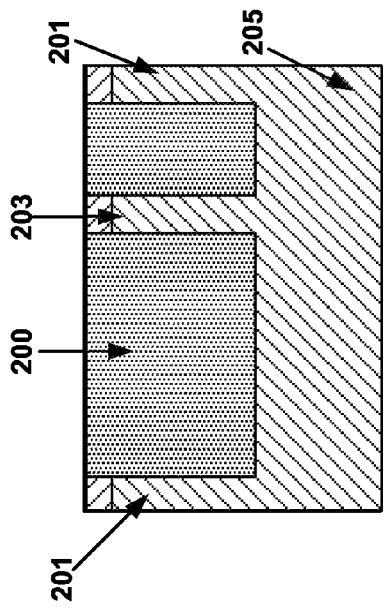
Figure 6A:
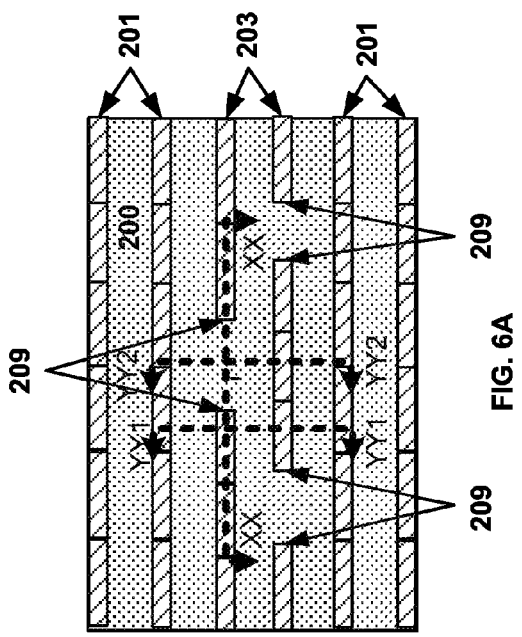
Figure 6C:
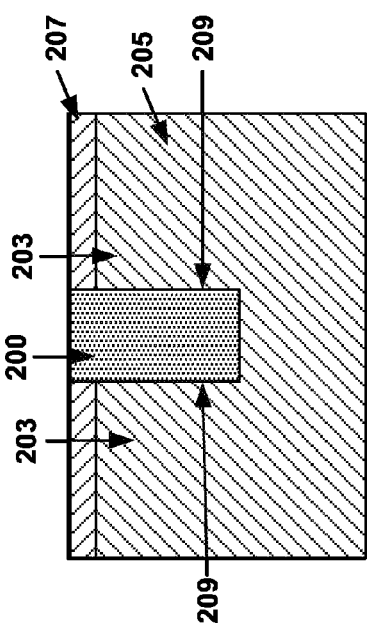
Figure 7B:
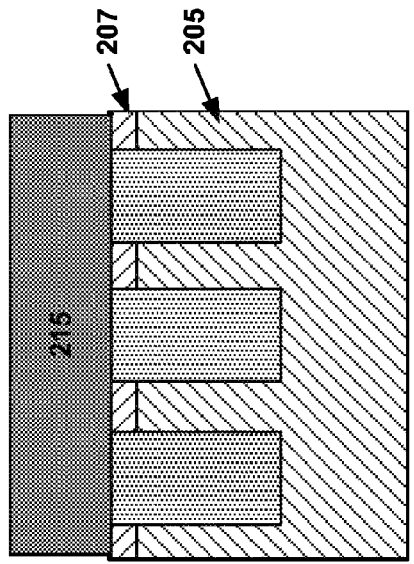
FIGS. 7A-7D are respectively a top and cross-sectional diagrams depicting fin formation in the process of fabricating a FinFET according to a second embodiment of the invention.
Figure 7D:
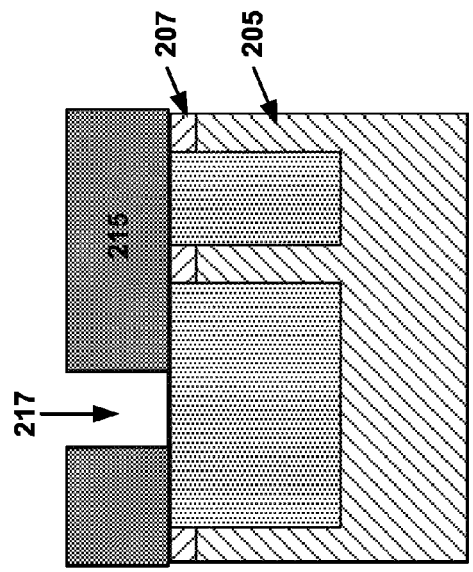
Figure 7A:
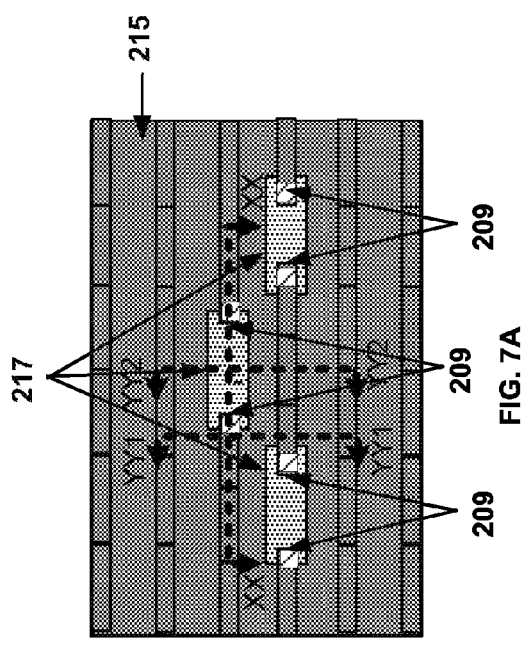
Figure 7C:
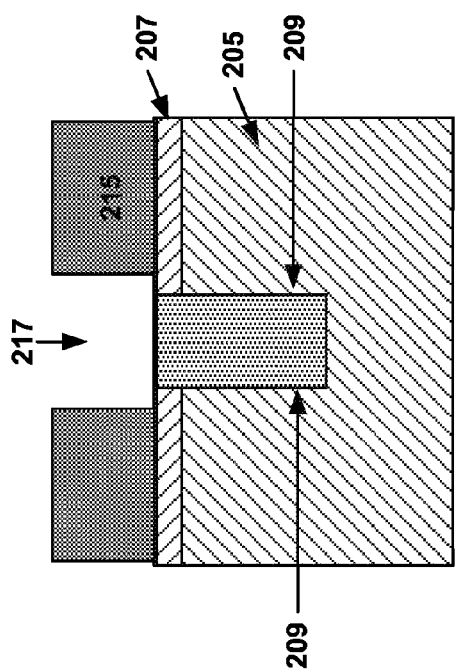
Figure 9B:
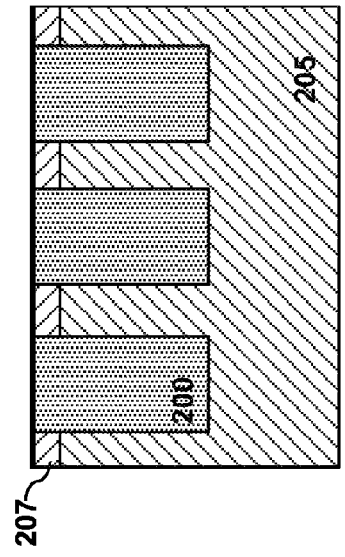
FIGS. 9A-9D are respectively a top and cross-sectional diagrams depicting fin formation in the process of fabricating a FinFET according to a second embodiment of the invention.
Figure 9D:
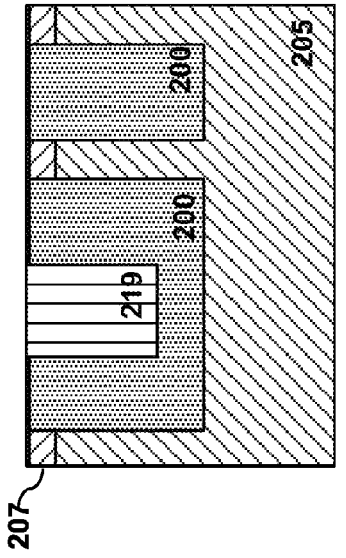
Figure 9A:
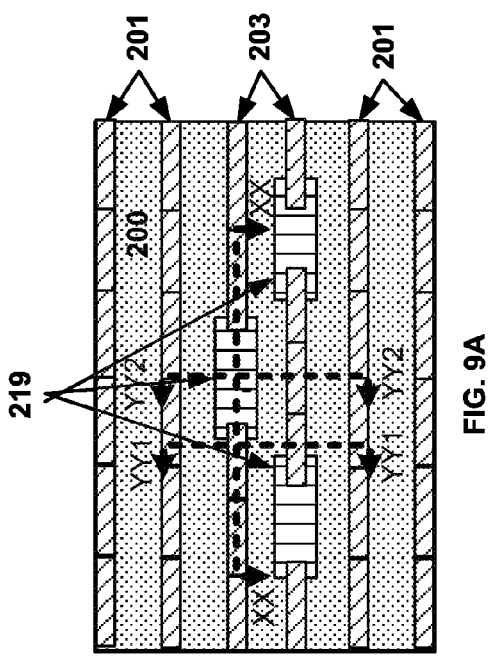
Figure 9C:
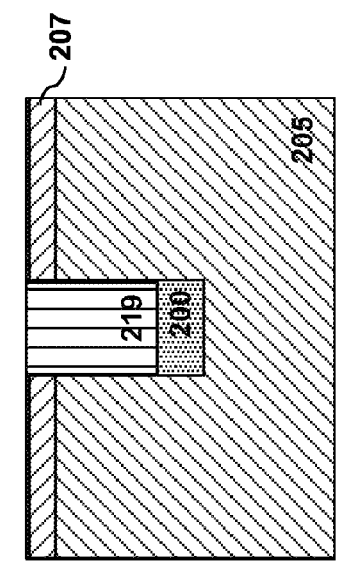
Figure 10B:
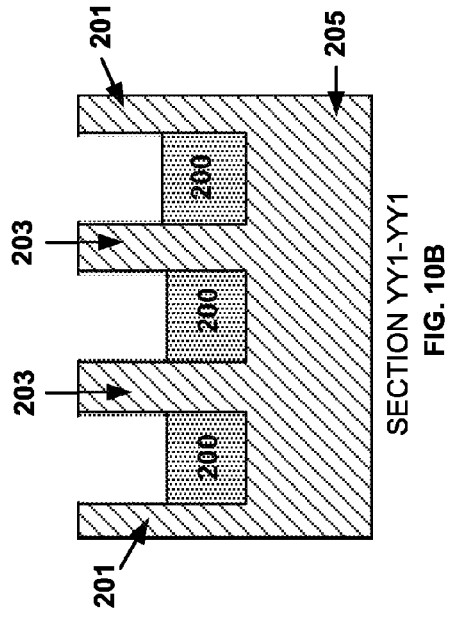
FIGS. 10A-10E are respectively a top and cross-sectional diagrams depicting fin formation in the process of fabricating a FinFET according to a second embodiment of the invention.
Figure 10A:
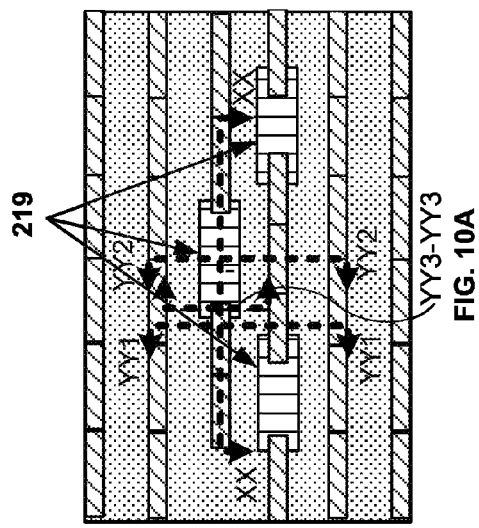
Figure 10E:
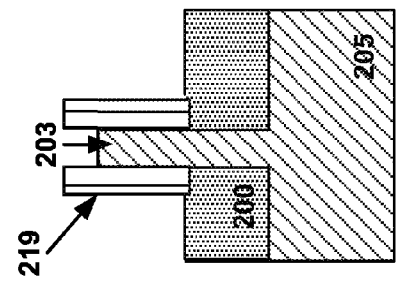
Figure 10D:
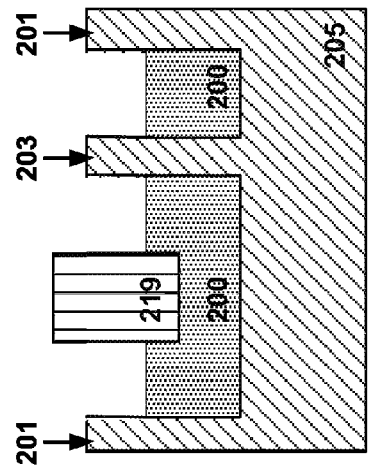
Figure 10C:
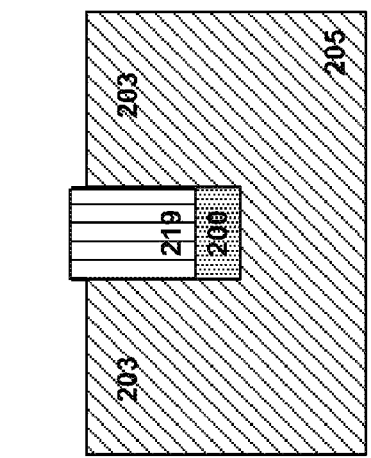
Figure 11B:
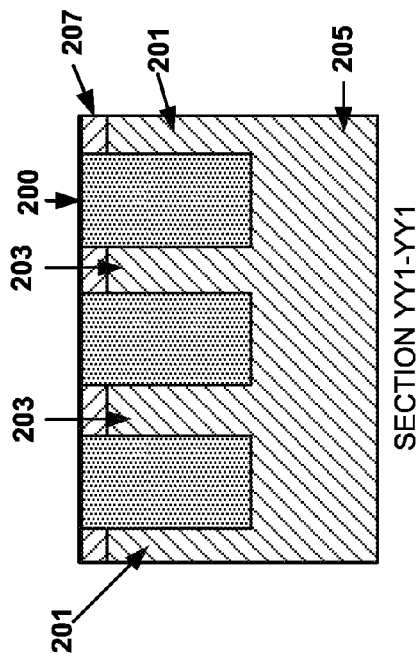
FIGS. 11A-11D are respectively a top and cross-sectional diagrams depicting fin formation in the process of fabricating a FinFET according to a third embodiment of the invention.
Figure 11D:
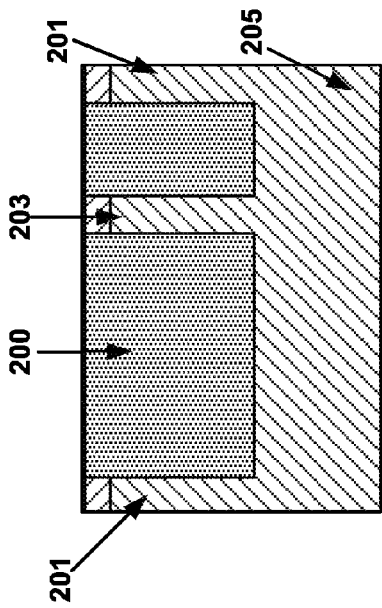
Figure 11A:
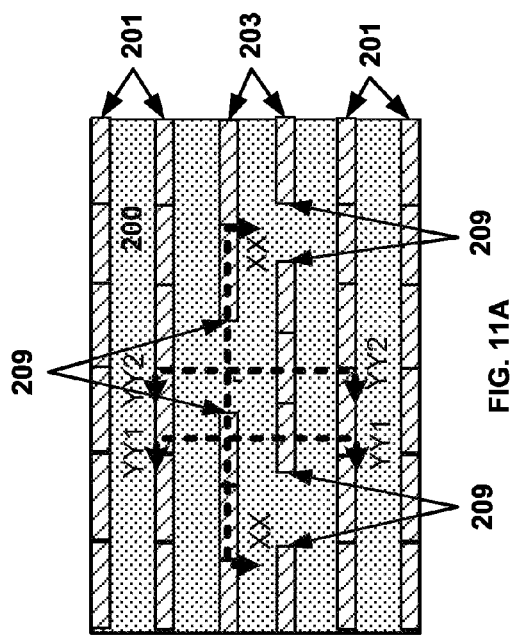
Figure 11C:
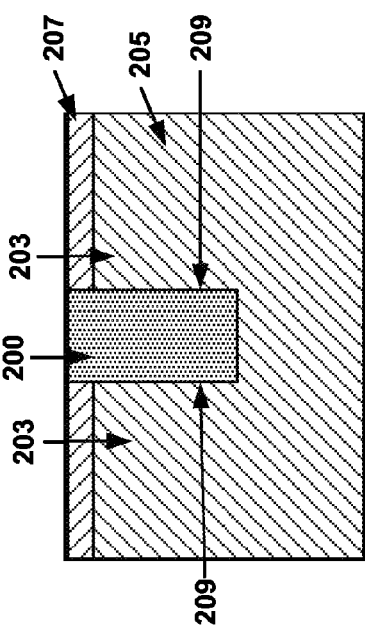
Figure 14B:
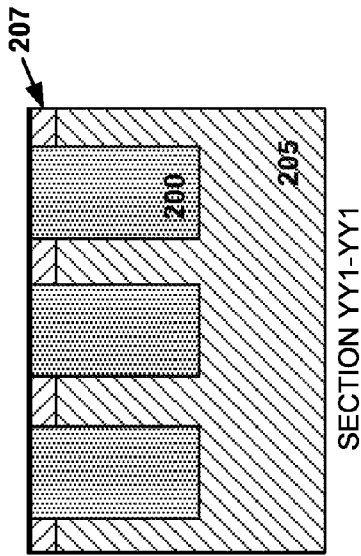
FIGS. 14A-14D are respectively a top and cross-sectional diagrams depicting fin formation in the process of fabricating a FinFET according to a third embodiment of the invention.
Figure 14D:
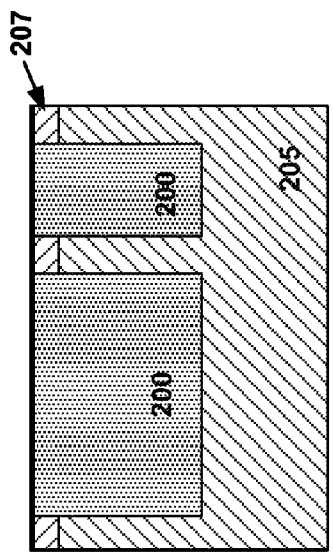
Figure 14A:
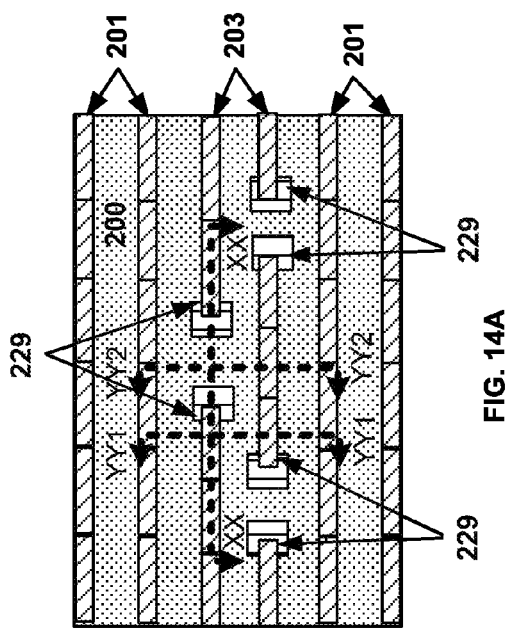
Figure 14C:
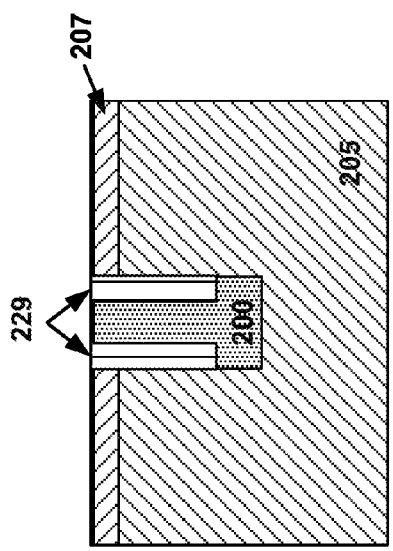
Figure 15B:
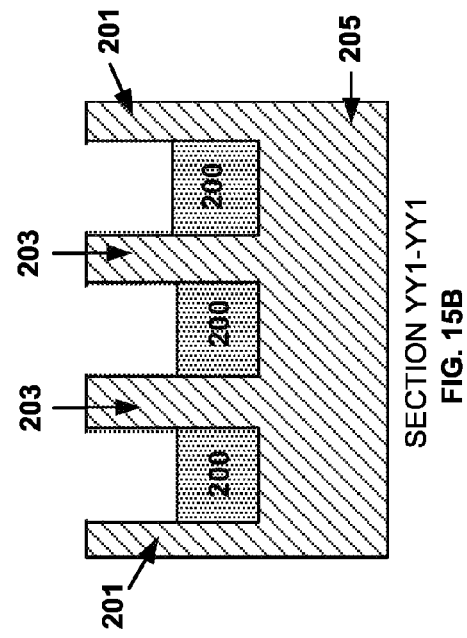
FIGS. 15A-15E are respectively a top and cross-sectional diagrams depicting fin formation in the process of fabricating a FinFET according to a third embodiment of the invention.
Figure 15A:
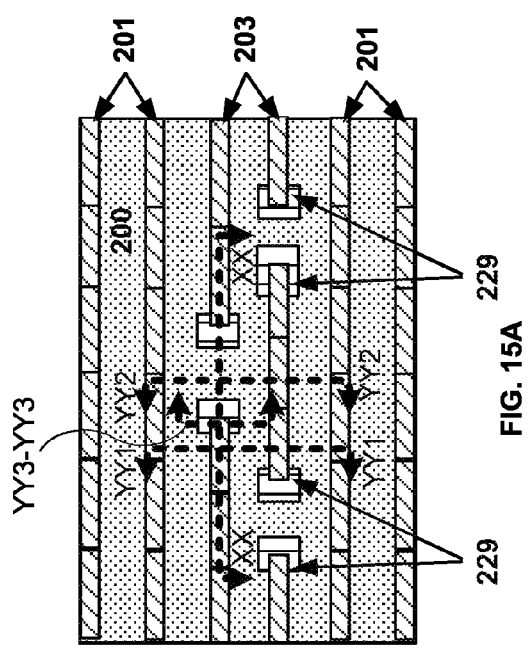
Figure 15E:
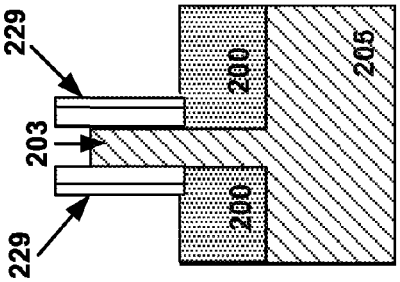
Figure 15D:
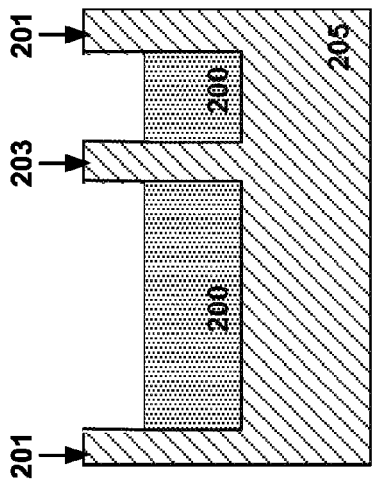
Figure 15C:
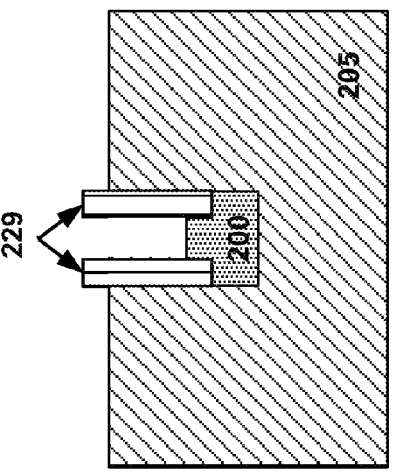

FIGS. 2A-2D are respectively a top and cross-sectional diagrams depicting fin location in the process of fabricating a set of FinFETs according to a first embodiment of the invention. Fins 201 in which the nFinFETs will be formed and fins 203 in which the pFinFETs will be formed have been defined in the silicon 205 by means of a patterned hard mask 207 followed by an etch. An insulator 200, e.g., a dielectric, isolates the fins 201 and 203 from each other. The notations XX, Y1Y1 and Y1Y2 are used to denote the positions of the cross-sections depicted in FIGS. 2B-2D in the top view in FIG. 2A. Thus, the XX cross-section shown in FIG. 2C illustrates the cross-section from fin end 209 to fin end 209. The Y1Y1 cross-section shown in FIG. 2B illustrates the cross-section across the structures which will become four FinFETs, fins 201 will become nFinFETs and fin 203 will become pFinFETs. The Y2Y2 cross-section shown in FIG. 2D illustrates the cross-section across the two fins 201 which will become nFinFETs, one fin 203 which will become pFinFETs and the oxide 200 which separates and isolates the fin ends 209. The practice of denoting the cross-sections is continued in the remaining drawings.

To get the structure depicted in FIGS. 2A-2D, many processes could be used. One is outlined below. An SOI substrate that includes a silicon layer 205 disposed on a buried oxide (BOX) layer (not shown) is provided. The hard mask layer 207 is formed and patterned on the silicon layer 205 by means of a sacrificial mandrel layer (e.g., polysilicon) and silicon oxide sidewall structures (both not shown). The hard mask layer 207 of this embodiment is silicon nitride (SiN). After the polysilicon structure is removed, the silicon oxide structures are used as the pattern to etch the hard mask 207, and the silicon oxide and hard mask 207 layers are used as the mask to etch the silicon layers 205 to form fin structures 201 and 203.

The oxide structures are then removed, and the shallow trench isolation (STI) process deposits one or more dielectric materials 200, such as silicon dioxide to fill the trenches, and removes the excess dielectric using a technique such as chemical-mechanical polishing (CMP). Next, a pattern using with a lithography process is formed and etching is performed to cut the fin ends of the FinFET structure. Another oxide deposition is performed to fill the trench at the fin ends and another CMP step removes the excess dielectric.

FIGS. 3A-3D are respectively a top and cross-sectional diagrams depicting a next step in the process of fabricating a FinFET according to a first embodiment of the invention. In these figures, a photoresist mask 211 has been patterned protecting the areas in which the dielectric 200 isolates and separates the fin ends 209 from each other. In the embodiments of the invention, the photoresist pattern over the fin ends differs from the photoresist pattern over other areas of the FinFET structure. In the first embodiment of the invention, a dielectric block is fabricated which covers the fin ends 209 and extends from fin end to fin end.

FIGS. 4A-4D are respectively a top and cross-sectional diagrams depicting an oxide recess step in the process of fabricating a FinFET according to a first embodiment of the invention. In these figures, the dielectric 200, e.g. silicon dioxide has been etched to reveal the tops of the fins 201, 203. The photoresist mask 211 protects oxide 200 the fin ends 209 where the pFinFETs will be formed. Thus, the fin ends 209 remain covered by oxide unlike the exposed sections of the fins 201, 203.

FIGS. 5A-5D are respectively a top and cross-sectional diagrams depicting the exposed fins in the process of fabricating a FinFET according to a first embodiment of the invention. In this set of figures, the photoresist mask and the hard mask layers have been removed. As is known, the photoresist is removed by an appropriate solvent. The hard mask layer is removed by an etch selective to the hard mask material as compared to the oxide. Protective oxide forms a block 213 which extends from fin end to fin end and covers the fin ends 209. In one preferred embodiment, as shown, the set of dielectric blocks cover three vertical sides of the set of the fin ends. Thus, when the epitaxial silicon is grown in future steps, it will not grow from the protected silicon at the fin ends.

FIGS. 6A-6D are respectively a top and cross-sectional diagrams depicting fin formation in the process of fabricating a FinFET according to a second embodiment of the invention. These diagrams show a similar starting step to that shown in FIGS. 2A-2D and the remarks made above apply to these figures as well.

FIGS. 7A-7D are respectively a top and cross-sectional diagrams depicting photoresist formation in the process of fabricating a FinFET according to a second embodiment of the invention. The photoresist layer 215 is patterned so that openings 217 in the photoresist are formed at the fin ends 209.

FIGS. 8A-8D are respectively a top and cross-sectional diagrams depicting trench formation in the process of fabricating a FinFET according to a second embodiment of the invention. After the photoresist 215 patterning, an etch step clears the oxide 200 at the fin ends 209. In the drawing, some oxide 200 is left at the bottom of the trench. However, in alternative embodiments, the etch can be continued until all of the oxide is removed and the trench extends down to the silicon layer 205.

FIGS. 9A-9D are respectively a top and cross-sectional diagrams depicting a block formation in the process of fabricating a FinFET according to a second embodiment of the invention. These figures show the structure after a silicon carbide (SiC) deposition and a chemical mechanical polishing step to remove the excess SiC from the areas surrounding the SiC 219 blocks. In the figures, the blocks 219 are a composite of a silicon dioxide base and a SiC top portion, however, in alternative embodiments where the trench is extended to the silicon layer 205, the blocks could be made entirely of SiC. In preferred embodiments, the height of the SiC portion of the dielectric blocks is at least as high as the height which the fins will protrude as the result of a fin recess process as shown in FIGS. 10A-10E.

FIGS. 10A-10E are respectively a top and cross-sectional diagrams depicting the block structure formation in the process of fabricating a FinFET according to a second embodiment of the invention. In this set of figures, the hard mask layer has been removed by an etch selective to the hard mask material. The dielectric 200 has been etched in a fin recess process to reveal the tops of the fins 201, 203. The SiC block 219 extends and covers the fin ends 209. In one preferred embodiment, as shown, the set of dielectric SiC blocks cover three vertical sides of the set of the fin ends. Thus, when the epitaxial silicon is grown in future steps, it will not grow from the protected silicon at the fin ends.

FIGS. 11A-11D are respectively a top and cross-sectional diagrams depicting fin formation in the process of fabricating a FinFET according to a third embodiment of the invention. These diagrams show a similar starting step to that shown in FIGS. 2A-2D and FIGS. 6A-6D and the remarks made above apply to these figures as well.

FIGS. 12A-12D are respectively a top and cross-sectional diagrams depicting photoresist layer formation in the process of fabricating a FinFET according to a third embodiment of the invention. The photoresist layer 221 is patterned so that openings 223 in the photoresist are formed at the fin ends 209. In contrast to the photoresist pattern formed in the second embodiment, in the third embodiment two separate openings are formed, one at each fin end, rather than the single opening which extends from fin end to fin end in the second embodiment.

FIGS. 13A-13D are respectively a top and cross-sectional diagrams depicting trench formation in the process of fabricating a FinFET according to a third embodiment of the invention. After the photoresist 221 patterning, an etch step clears the oxide 200 at the fin ends 209. In the drawing, some oxide 200 is left at the bottom of the trench. However, in alternative embodiments, the etch can be continued until all of the oxide is removed and the trench extends down to the silicon layer 205.

FIGS. 14A-14D are respectively a top and cross-sectional diagrams depicting block formation in the process of fabricating a FinFET according to a third embodiment of the invention. These figures show the structure after a silicon carbide (SiC) deposition and a chemical mechanical polishing step to remove the excess SiC from the areas surrounding the SiC 219 blocks. In the figures, the blocks 219 are a composite of a silicon dioxide base and a SiC top portion, however, in alternative embodiments where the trench is extended to the silicon layer 205, the SiC blocks can extend down to the silicon 205. In contrast, to the blocks of the second embodiment, in these figures there are two separate blocks 229 of SiC. In preferred embodiments, the height of the SiC portion of the dielectric blocks is at least as high as the height which the fins will protrude as the result of a fin recess process as shown in FIGS. 15A-15E. In other words, the second dielectric portion of the dielectric block is at least as high as a distance between the top surface of the fins and the top surface of the dielectric isolating the fins from one another.

FIGS. 15A-15E are respectively a top and cross-sectional diagrams depicting fin formation in the process of fabricating a FinFET according to a third embodiment of the invention. In this set of figures, the hard mask layer has been removed by an etch selective to the hard mask material. The dielectric 200 has been etched to reveal the tops of the fins 201, 203. The SiC blocks 229 extends and covers the fin ends 209. In one preferred embodiment, as shown, the set of dielectric blocks cover three vertical sides of the set of the fin ends. Thus, when the epitaxial silicon is grown in future steps, it will not grow from the protected silicon at the fin ends.

The invention has several benefits over the prior art. By preventing epitaxial growth at the fin ends of a FinFET, the dimensions of the integrated circuit can be reduced as the spacing between the active PU FinFETs is not as much of a limiting factor. In addition, the yield of SRAMs built according to the prevent invention is improved.

Those skilled in the art will appreciate that variations from the above embodiments are within the scope of the invention. For example, in a variation of the first embodiment, two separate dielectric blocks could be formed from the dielectric trench material, much like the separate SiC blocks in the third embodiment.

While only one or a limited number of features are illustrated in the drawings, those ordinarily skilled in the art would understand that many different types features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for preventing epitaxial growth in a semiconductor device comprising:
    cutting a set of long fins into a set of fins of a FinFET structure, the set of fins having respective cut faces of a set of cut faces located at respective fin ends of a set of fin ends;
    patterning a photoresist layer over the set of fin ends of the set of fins of the FinFET structure, wherein the set of fins are isolated from one another by a first dielectric material, wherein a photoresist pattern over the set of fin ends differs from a photoresist pattern over other areas of the FinFET structure; and
    forming a set of dielectric blocks on the set of fin ends covering respective cut faces of the set of cut faces; and
    wherein the set of dielectric blocks prevents epitaxial growth at the cut faces of the set of fin ends in a subsequent epitaxial growth step.

2. The method as recited in claim 1, wherein the photoresist pattern over the set of fin ends comprises openings over the fin ends, the method further comprising:
    etching a set of trenches in the first dielectric material at the set of fin ends;
    depositing a layer of a second dielectric material in the set of trenches; and
    removing excess portions of the second dielectric leaving a set of dielectric blocks of the second dielectric material at the set of fin ends.

3. The method as recited in claim 2, further comprising selectively etching the first dielectric around the FinFET structure to reveal the set of fins for further processing, and leaving blocks of the second dielectric material.

4. The method as recited in claim 3, wherein the set of blocks comprises a set of composite dielectric blocks comprising the first and the second dielectrics.

5. The method as recited in claim 4, wherein the first dielectric is silicon oxide and the second dielectric is silicon carbide.

6. A method for preventing epitaxial growth in a semiconductor device comprising:
   cutting a set of long fins into a set of fins of a FinFET structure, the set of fins having respective cut faces of a set of cut faces located at respective fin ends of a set of fin ends;
   patterning a photoresist layer over the set of fin ends of the set of fins of the FinFET structure, wherein the set of fins are isolated from one another by a first dielectric material, wherein a photoresist pattern over the set of fin ends differs from a photoresist pattern over other areas of the FinFET structure;
   forming a set of dielectric blocks on the set of fin ends covering respective cut faces of the set of cut faces;
   performing a fin recess process wherein the set of dielectric blocks have a top surface at or above a top surface of the fins and a dielectric isolating the fins from one another has a top surface lower than the top surface of the top surface of the fins; and
   wherein the set of dielectric blocks prevents epitaxial growth at the set of fin ends in a subsequent epitaxial growth step.

7. The method as recited in claim 6, wherein the photoresist pattern over the set of fin ends comprises openings over the fin ends, wherein the set of dielectric blocks is composed in part of a second dielectric, the method further comprising:
   etching a set of trenches in the first dielectric material at the set of fin ends;
   depositing a layer of a second dielectric material in the set of trenches; and
   removing excess portions of the second dielectric leaving a set of blocks of the second dielectric material at the set of fin ends.

8. The method as recited in claim 6, wherein the set of dielectric blocks cover three vertical sides of respective ones of the set of the fin ends wherein one of the vertical sides is the cut face.

9. The method as recited in claim 7, wherein the set of dielectric blocks comprise a composite of the first dielectric and the second dielectric and a height of a portion of the set of dielectric blocks composed of the second dielectric is at least as high as a distance between the top surface of the fins and the top surface of the dielectric isolating the fins from one another.

* * * * *